(12) United States Patent
Zhang et al.

(10) Patent No.: US 8,198,737 B2
(45) Date of Patent: Jun. 12, 2012

(54) METHOD OF FORMING WIRE BONDS IN SEMICONDUCTOR DEVICES

(75) Inventors: Changliang Zhang, Tianjin (CN); Yingwei Jiang, Tianjin (CN); Zhijie Wang, Tianjin (CN); Wei Xiao, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 129 days.

(21) Appl. No.: 12/510,274

(22) Filed: Jul. 28, 2009

(65) Prior Publication Data

US 2010/0314754 A1 Dec. 16, 2010

(30) Foreign Application Priority Data

Jun. 16, 2009 (CN) .......................... 2009 1 0159553

(51) Int. Cl.
*H01L 23/48* (2006.01)
*H01L 23/52* (2006.01)
*H01L 29/40* (2006.01)
(52) U.S. Cl. ........................................ 257/780; 257/784
(58) Field of Classification Search .................. 257/780, 257/781, 784
See application file for complete search history.

(56) References Cited

U.S. PATENT DOCUMENTS

| | | | |
|---|---|---|---|
| 4,908,685 A | 3/1990 | Shibasaki et al. | |
| 6,051,450 A | 4/2000 | Ohsawa et al. | |
| 6,165,887 A | 12/2000 | Ball | |
| 6,564,449 B1 | 5/2003 | Tsai et al. | |
| 7,417,324 B2 * | 8/2008 | Obiya | 257/780 |
| 2003/0205725 A1 * | 11/2003 | Masumoto et al. | 257/200 |
| 2003/0230796 A1 * | 12/2003 | Ismail et al. | 257/686 |
| 2004/0072396 A1 | 4/2004 | Tiziani et al. | |
| 2005/0191839 A1 * | 9/2005 | Wong et al. | 438/617 |
| 2007/0262446 A1 * | 11/2007 | Hung | 257/737 |
| 2008/0023831 A1 * | 1/2008 | Nishimura et al. | 257/737 |
| 2009/0080872 A1 * | 3/2009 | Steinel et al. | 392/379 |
| 2009/0321927 A1 * | 12/2009 | Nishimura et al. | 257/737 |

* cited by examiner

*Primary Examiner* — S. V. Clark
(74) *Attorney, Agent, or Firm* — Charles Bergere

(57) ABSTRACT

A method of forming a wire bond in a semiconductor device includes forming a first bump of a first composition proximate to a probe mark on a bond pad. A second bump of the first composition is formed adjacent to the first bump such that the first and second bumps are formed away from the probe mark. A wire of a second composition that is harder than the first composition is attached on top of the first and second bumps to form an interconnection.

10 Claims, 5 Drawing Sheets

METHOD OF FORMING WIRE BONDS IN SEMICONDUCTOR DEVICES

BACKGROUND OF THE PRESENT INVENTION

The present invention relates generally to semiconductor devices, and, more specifically, to a method of wire bonding in semiconductor devices.

Wire bonding is the most commonly used semiconductor device electrical interconnect technology. Wire bonding is a solid phase welding technique that uses a combination of heat, pressure, and ultrasonic energy to form a bond between an interconnect wire and a bond pad surface through atomic diffusion and electron sharing.

Earlier wire bonding technology used gold wires for forming electrical connection. In recent years, copper has emerged as viable substitute for gold wires. Copper wire bonding not only provides significant cost benefits but also offers several mechanical and electrical advantages. However, use of copper in wire bonding also poses several challenges. Copper is harder than gold, and thus, a copper wire needs greater mechanical force and ultrasonic power to form a bond with the die bond pads.

It is well known that the copper wire bonding process subjects the semiconductor device to significant thermal and mechanical stress, which can damage the layers of metal and dielectric underlying the die bond pad, also known as silicon cratering. Cratering adversely affects the quality and reliability of a wire bond. The major factors responsible for the damage include the mechanical impact of the capillary during the ball bonding process; ultrasonic vibration frequency and energy; and process temperature.

One of the emerging trends in semiconductor fabrication is the use of dielectric materials with low dielectric constants. Examples of such materials include silicon-containing hydrogen compounds, aero-gels, and organic compounds. Such materials are preferable as they help to reduce the effective capacitances, and thus, facilitate achieving increased speed of processing in semiconductor devices. However, such materials are mechanically weaker than the conventional dielectric materials (deposited using chemical vapor deposition techniques). Accordingly, use of such materials in semiconductor devices greatly aggravates the cratering problem discussed above.

Another important factor leading to failure of wire bonds is excessive bond pad probing. The semiconductor chip is subjected to various electrical tests using probes. Probe testing leaves probe marks or scratches on the bond pads that deform the surface topography of the bond pad, making it uneven and rough. The probe tip can even cause the bond pad underlayers to be exposed. Thus, probe marks hinder effective inter-metallization between the wire and the bond pad and accordingly, adversely affect the integrity of wire bonds.

Copper also is used to form the chip bond pads. However, copper has a tendency to oxidize, forming copper oxide compounds, which hinder inter-metallization during wire bonding. To overcome this problem, the industry practice is to cap copper bond pads with aluminum. However, as discussed above, probe tips can gouge the surface of the bond pad such that the aluminum upper layer is scratched and the underlying copper layer is exposed, which leads to the formation of copper oxides.

It also is desirable to reduce the thickness of the chip bond pads. However, bond pads with reduced thickness cannot bear the mechanical impact generated during the wire bonding process and are sometimes damaged. Therefore, another important challenge is to be able to reduce the bond pad thickness and yet obtain a reliable wire bond with sufficient mechanical strength.

Further, the number of bond pads is steadily increasing, the bond pad pitch is being reduced, and the individual bond pads are becoming much smaller and consequently, the area of contact available for bonding is shrinking. With the shrinking sizes of the bond pads, the area of the bond pad that is damaged by the probe tip is increasing, causing greater and greater hindrance to crimping and alloy formation during bonding process. Thus, the pad damage due to the probe marks leads to wire bond failure conditions, such as non-stick on pad and lifted bonds.

It would be advantageous to be able to reliably bond copper wire to small, thin bond pads.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
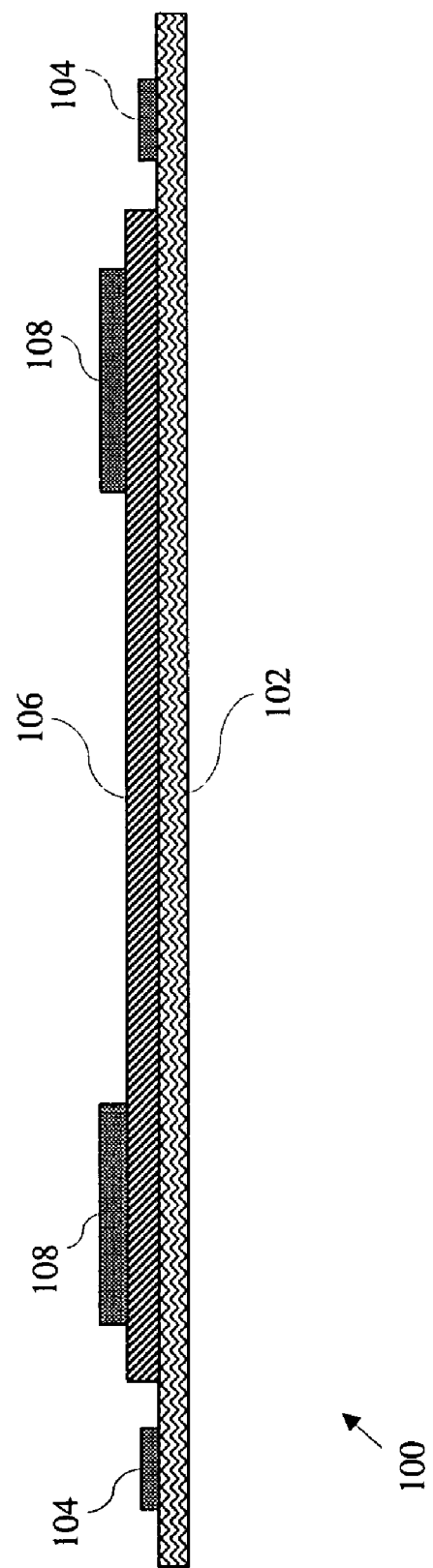
FIG. 1 is a cross-sectional side view of a semiconductor device in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method of forming a wire bond for electrically connecting a first conductive region to a second conductive region in a semiconductor device includes forming a first bump of a first composition on the first conductive region. The first bump is formed proximate to a probe mark on the first conductive region. A second bump of the first composition is formed on the first conductive region, adjacent to the first bump. The first and second bumps are formed away from the probe mark on the first conductive region. The method further includes bonding a first end of a wire of a second composition on top of the first and second bumps. A second end of the wire is then connected to the second conductive region.

In another embodiment of the invention, an electrical connection between a wire and a bond pad on a semiconductor chip is provided. The electrical connection includes a first bump of a first composition formed on the bond pad. The first bump is formed proximate to a probe mark on the bond pad. A second bump of the first composition is formed on the bond pad adjacent to the first bump. The first bump and the second bumps are formed away from the probe mark on the bond pad. The wire is then attached to the first and second bumps with a ball bond. The wire is made of a second composition. The wire at least partially penetrates the first and second bumps.

Embodiments of the present invention provide a method of forming wire bonds in semiconductor devices. The material of the first composition (i.e., the first and second bumps) is preferably softer than the wire and thus absorbs the mechanical impact of the wire on the pad during wire bonding, which preserves the bond pad and the underlying layers thereof from mechanical damage and consequently, enables the use of wires, formed of, for example, copper. Copper wires are comparatively less expensive than gold wires, thereby reducing the manufacturing cost of the semiconductor device. Additionally, copper wires have better electrical and thermal conductivities as compared to gold, and thus, use of copper wires improves the electrical properties of the interconnection. Further, the present invention enables the use of dielectric materials with low dielectric constant (low-k dielectric material) in the semiconductor device without silicon cratering. In addition, mitigation of the effect of thermal and mechanical stress generated during wire bonding by the first and second bumps facilitates reduction in bond pad thickness and use of hard metal wires on thinner bond pads. Also, the penetration of the ball bond into the first and second bumps makes the connection mechanically more stable. Preferably, the first and second bumps are formed away from all or most of any probe mark present on the bond pad, thereby mitigating the impact of the probe mark during wire bonding and consequently, increasing the reliability of the semiconductor device.

Referring now to FIG. 1, a schematic diagram illustrating a semiconductor device assembly 100 in accordance with an embodiment of the present invention is shown. The semiconductor device assembly 100 includes a substrate 102. In an embodiment of the present invention, the substrate 102 may be any suitable substrate, such as a ceramic substrate, a silicon substrate, or an organic substrate and may have any suitable thickness. The substrate 102 includes a plurality of conductive regions such as contact pads 104 that are located near a periphery of a first or top surface of the substrate 102. A semiconductor die or chip 106 is mounted on the top surface of the substrate 102 such that a passive surface of the semiconductor chip 106 contacts the top surface of the substrate 104 and an active surface of the chip 106 faces away from the top surface of the substrate 104. The active surface of the semiconductor chip 106 includes a plurality of conductive regions or bond pads 108 for providing electrical connections to the substrate 102. In an embodiment of the present invention, the bond pads 108 are made of copper capped with aluminum or alloyed aluminum.

Figure 2:
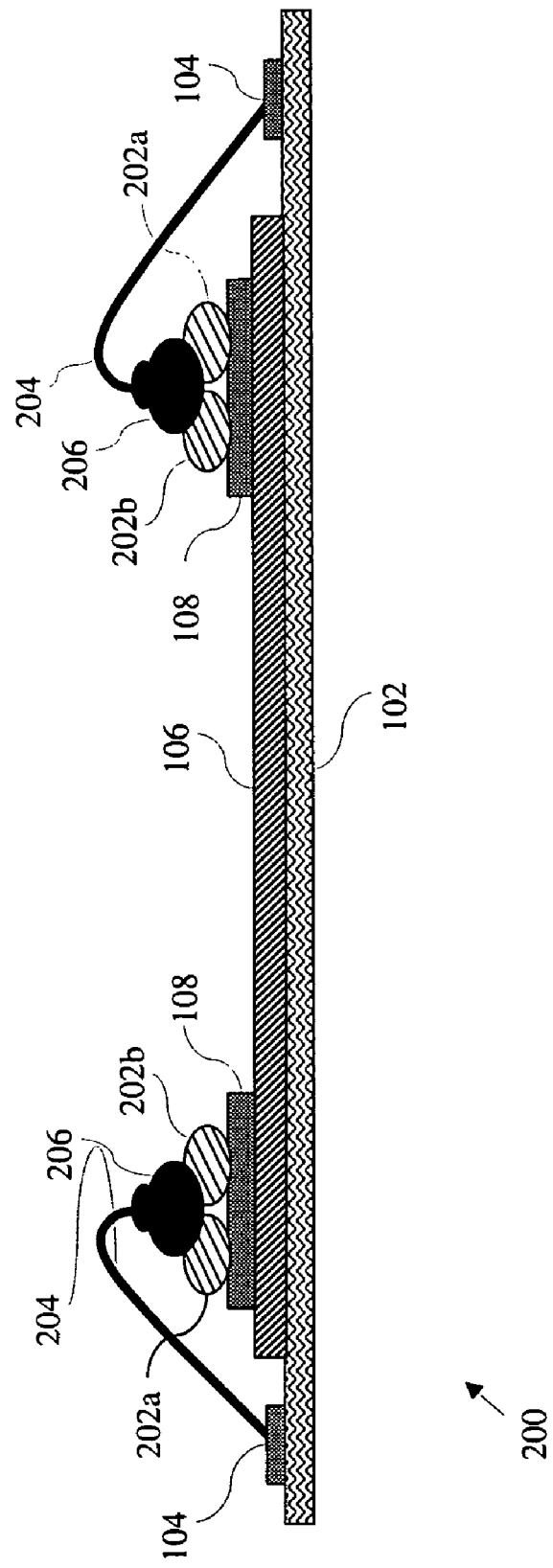
FIG. 2 is a cross-sectional side view of a semiconductor package in accordance with an embodiment of the present invention.

Referring now to FIG. 2, a schematic diagram illustrating a cross-sectional view of a semiconductor package 200 is shown, in accordance with an embodiment of the present invention. The semiconductor package 200 includes the substrate 102 and the semiconductor chip 106. On each bond pad 108 of the semiconductor chip 106, a first bump 202a and a second bump 202b are formed. The first bump 202a and the second bump 202b are formed using a material having a first composition. Examples of the first composition include, but are not limited to, gold, silver, palladium, and combinations thereof. The semiconductor chip 106 is electrically connected with the substrate 102 with wires 204. The wires 204 may be pure metal wires or alloy-based wires, and may be insulated or coated with an insulator. The wires 204 are formed using a material having a second composition. In an embodiment of the invention, the second composition is harder than the first composition. Examples of the second composition include, but are not limited to, aluminum, copper, and combinations thereof. The wires 204 are attached to the first and second bumps 202a and 202b via ball bonding. A ball bond 206 is shown in FIG. 2. The wire 204 preferably at least partially penetrates the first and second bumps 202a and 202b, as depicted in FIG. 2.

A second end of the wire 204 is connected to the contact pad 104 of the substrate 102. In an embodiment of the present invention, the second end of the wire 204 is electrically connected to the contact pad 104 using a wedge bonding technique. During wedge bonding, the second end of the wire 204 is made to come in contact of the contact pad 104 and a combination of heat, pressure, and ultrasonic energy are provided to affect a bond between the wire 204 and the contact pad 104.

Figure 3:
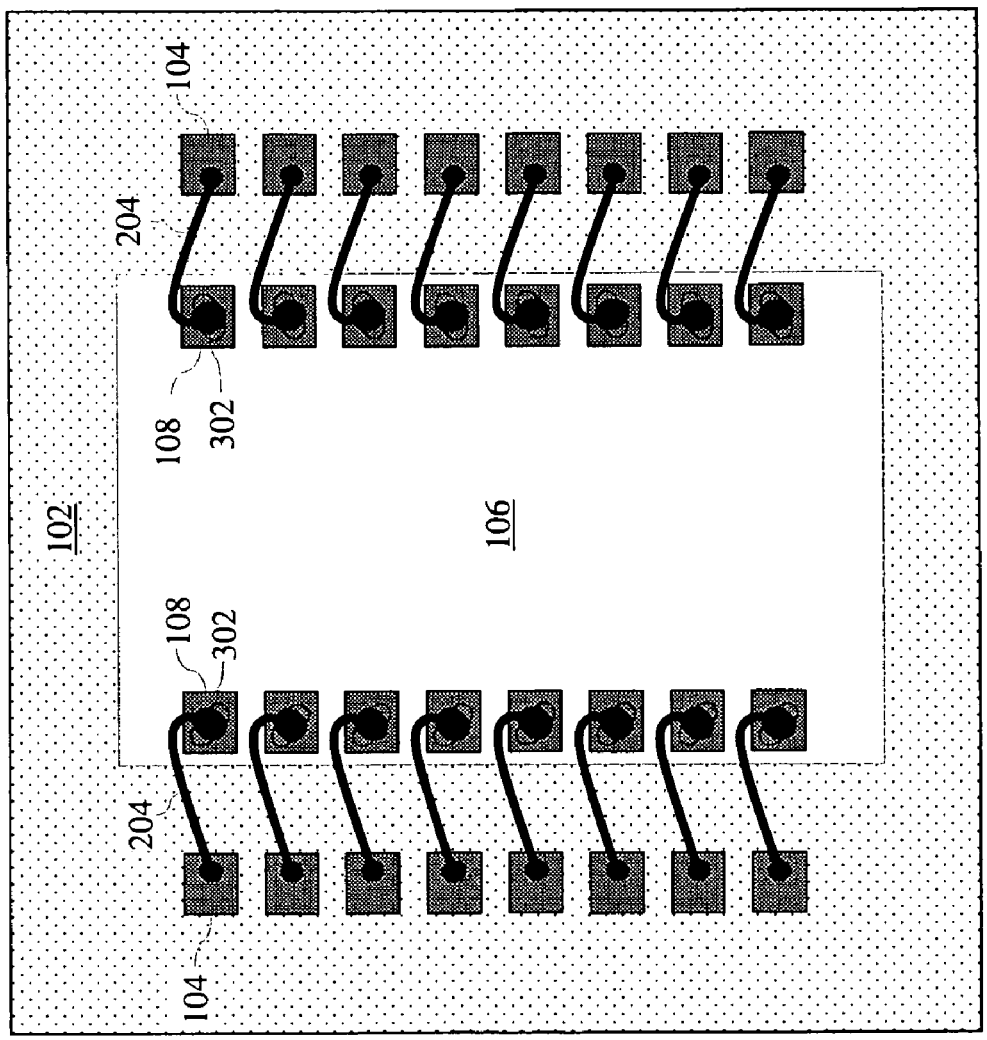
FIG. 3 is a top view of the semiconductor package of FIG. 2.

Referring now to FIG. 3, a schematic diagram illustrating a top view of the semiconductor package 200 of FIG. 2 is shown. The bond pads 108 of the semiconductor chip 106 are electrically connected to the contact pads 104 of the substrate 102 with the wires 204. A plurality of electrical connection assemblies such as electrical connection assemblies 302 are formed on each bond pad 106 of the semiconductor chip 106. Each electrical connection assembly includes the first and second bumps 202a and 202b, and the ball bond 206.

Figure 4B:
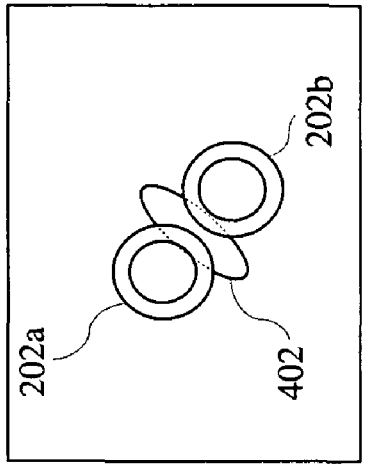
FIGS. 4A-4C are schematic diagrams illustrating various stages during the formation of an electrical connection between a wire and a bond pad of a semiconductor chip, in accordance with an embodiment of the present invention.
Figure 4C:
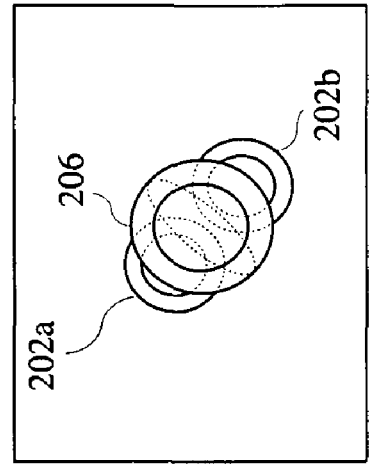
Figure 4A:
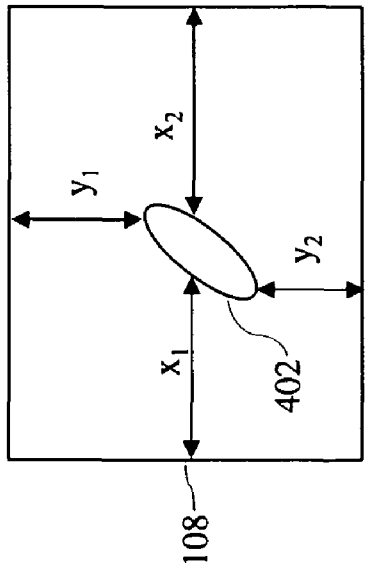

Referring now to FIGS. 4A-4C, schematic diagrams illustrating various stages during the formation of an electrical connection between the wire 204 and the bond pad 108 of the semiconductor chip 106 in accordance with an embodiment of the present invention are shown.

Referring to FIG. 4A, the location of a probe mark 402 on the bond pad 108 is identified. As known in the art, when a probe needle (not shown) contacts the bond pad 108, the pressure exerted by the probe needle may leave the probe mark 402 on the bond pad 108. In an embodiment of the invention, a suitable probe mark inspection technique is used to identify the location of the probe mark 402 on the bond pad 108. For example, the location of the probe mark may be identified using x-y coordinates in the plane of bond pad, where $x_1$ is a distance between a left boundary of the bond pad 108 and a left boundary of the probe mark 402 in the x-direction. Similarly, $x_2$ is a distance between a right boundary of the bond pad 108 and the right boundary of the probe mark 402 in the x-direction. $Y_1$ is a distance between an upper boundary of the bond pad 108 and the upper boundary of the probe mark 402 in the y-direction, and $y_2$ is a distance between the lower boundary of the bond pad 108 and the lower boundary of the probe mark 402 in the y-direction. The identified x-y coordinates describe the location of the probe mark 402 with respect to the bond pad 108, and are used to determine where the first and second bumps 202a and 202b are formed.

Referring now to FIG. 4B, the first bump 202a and the second bump 202b are formed proximate to the probe mark 402. The second bump 202b is formed adjacent to the first bump 202a, such that the first bump 202a and the second bump 202b are near to, but preferably not on the probe mark 402. In an embodiment of the present invention, a stud bumping technique may be used to form the first and second bumps 202a and 202b. In stud bumping, a wire made of the first composition and held in a capillary is drawn into a loop and then a high-voltage electric charge is applied to the wire. The electric charge melts the wire at the tip of the capillary, causing the formation of a stud bump. Thereafter, the capillary is lowered to the bond pad 108 of the semiconductor chip 106 and ultrasonic energy is applied. The combination of heat, pressure, and ultrasonic energy create the bond between the bump (either the first or second bump 202a or 202b) and the bond pad 108. In another embodiment of the invention, a ball dispensing technique may be used to form the first and second bumps 202a and 202b. In the ball dispensing technique, the first bump and second bumps 202a and 202b are placed on the bond pad 108 using a ball dispensing machines, such as HANMI BMS-500, MMS-MSA-250A, MicroPro, and MIZ BA-1200, and are attached to the bond pad 108 using an adhesive such as a conductive solder paste. In various embodiments of the present invention, the first and second bumps 202a and 202b are formed diagonally across the probe mark 402.

Referring now to FIG. 4C, the ball bond 206 is formed on top of the first and second bumps 202a and 202b. In an embodiment of the invention, the ball bond 206 is formed using a ball bonding technique in which the ball bond 206 at least partially penetrates the first and second bumps 202a and 202b, which provides for a mechanically strong bond.

Figure 5:
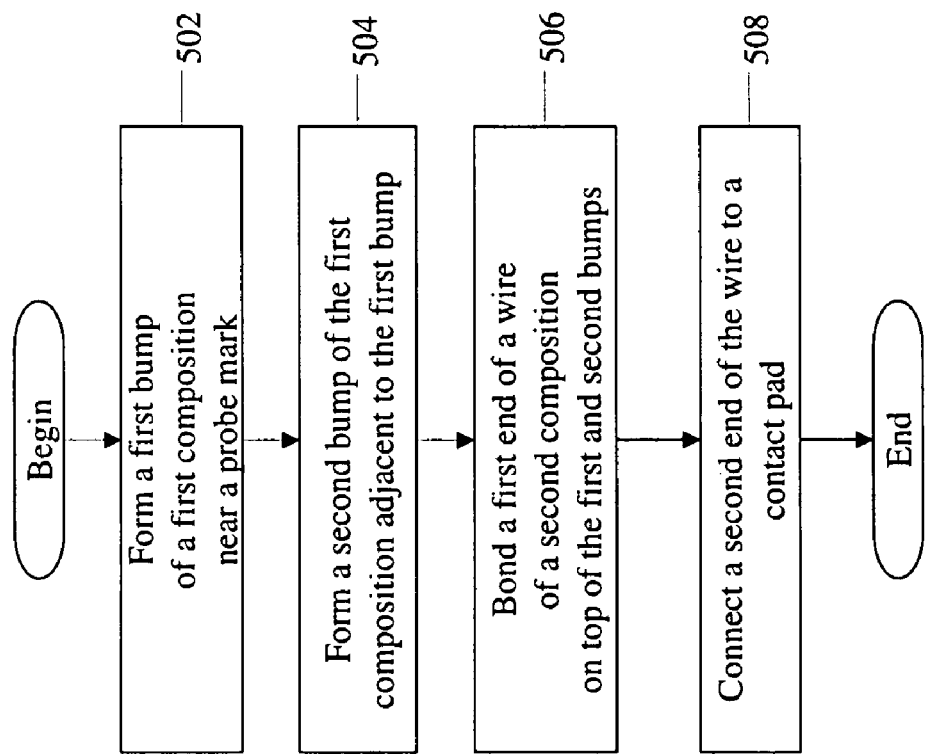
FIG. 5 is a flowchart illustrating a method of forming wire bonds in semiconductor devices, in accordance with an embodiment of the present invention.

Referring now to FIG. 5, a flowchart illustrating a method of forming a wire bond in accordance with an embodiment of the present invention is shown.

At step 502, a first bump of a first composition is formed proximate to a probe mark on a bond pad. Examples of the first composition include gold, silver, palladium or a combination thereof. In an embodiment of the invention, the probe mark is identified on the bond pad using a suitable probe mark identification technique such as with x-y coordinates as described above.

At step 504, a second bump of the first composition is formed adjacent to the first bump on the bond pad. In an embodiment of the present invention, the first and second bumps are formed diagonally across the identified probe mark on the bond pad. The first and second bumps are sized such that they may be near to, but not on the probe mark.

At step 506, a first end of a wire is bonded on top of the first and second bumps. The wire is selected from a group of wires consisting of pure metal, alloy-based, and coated or insulated wires. The wire is made of a material having a second composition, which preferably is harder than the first composition. Examples of the second composition include aluminum, copper, and a combination thereof. In one embodiment of the invention, the wire is attached to the first and second bumps via ball bonding in which the wire is forced to at least partially penetrate at least one of the first and second bumps. At step 508, a second end of the wire is connected to a contact pad of a substrate, thus forming an electrical connection between the chip bond pad and the substrate contact pad.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An electrical connection between a wire and a bond pad of a semiconductor chip, comprising:
    a first bump of a first composition formed on the bond pad;
    a second bump of the first composition formed on the same bond pad adjacent to the first bump; and
    a wire of a second composition different from the first composition attached on top of the first and second bumps, wherein the wire at least partially penetrates at least one of the first and second bumps.

2. The electrical connection of claim 1, wherein the first and second bumps are formed using a stud bumping technique.

3. The electrical connection of claim 1, wherein the first composition comprises a material that is softer than the second composition.

4. The electrical connection of claim 3, wherein the first composition comprises one of gold, silver, palladium or a combination thereof.

5. The electrical connection of claim 4, wherein the second composition comprises copper.

6. The electrical connection of claim 5, wherein the wire is one of pure metal, alloy-based, and coated wires.

7. An electrical connection between a wire and a single bond pad of a semiconductor chip, comprising:
    a first bump of a first composition formed on the single bond pad;
    a second bump of the first composition formed on the single bond pad adjacent to the first bump; and
    a wire of a second composition different from the first composition attached on top of the first and second bumps, wherein the second composition comprises a material that is harder than a material of the first composition and the wire at least partially penetrates at least one of the first and second bumps.

8. The electrical connection of claim 7, wherein the first and second bumps are formed using a stud bumping technique.

9. The electrical connection of claim 7, wherein the first composition comprises one of gold, silver, palladium or a combination thereof.

10. The electrical connection of claim 7, wherein the second composition comprises copper.

* * * * *